United States Patent [19]

Zuk

[11] 4,185,210
[45] Jan. 22, 1980

[54] CONTACT DE-BOUNCING CIRCUIT WITH COMMON MODE REJECTION

[75] Inventor: Borys Zuk, New Hope, Pa.

[73] Assignee: RCA Corporation, New York, N.Y.

[21] Appl. No.: 907,289

[22] Filed: May 18, 1978

[51] Int. Cl.² .............................................. H03K 5/18
[52] U.S. Cl. .................................. 307/232; 307/216; 307/247 A; 340/365 E
[58] Field of Search .................... 307/247 A, 232, 216; 328/109, 110, 71; 340/365 E

[56] References Cited

U.S. PATENT DOCUMENTS

| | | |
|---|---|---|
| 2,946,897 | 7/1960 | Mayo. |
| 2,947,945 | 8/1960 | Relis et al. |
| 3,721,833 | 3/1973 | Kramer. |
| 3,795,823 | 3/1974 | Morgan et al. .................. 307/247 A |
| 3,828,258 | 8/1974 | Hills et al. |
| 3,979,609 | 9/1976 | Schillhof. |
| 4,028,878 | 6/1977 | Droz et al. ...................... 307/247 A |
| 4,057,738 | 11/1977 | Nishimura. |

FOREIGN PATENT DOCUMENTS 2424816  4/1975  Fed. Rep. of Germany ...... 307/247 A

OTHER PUBLICATIONS

J. H. Hubbard et al., Glitch Free Pulse Generation and Contact Closure Detection, IBM Technical Disclosure Bulletin, vol. 19, No. 3, Aug. 1976, pp. 816–817.

John M. Irwin, "Coincident Pulse Eliminator," The Electronic Engineer, Mar. 1970, p. 85.

*Primary Examiner*—John Zazworsky
*Attorney, Agent, or Firm*—H. Christoffersen; Henry I. Schanzer

[57] ABSTRACT

A circuit for preventing the simultaneous application of contradictory input commands to a system and for filtering-out signals of shorter duration than a given period. The circuit includes an EXCLUSIVE-OR type gate adapted to receive input commands, whose output is "True" only when one of the input commands is present and no contradictory condition exists. The output of the gate is coupled to the input of a first flip flop which is set to a state indicative of the presence of the "True" signal at its input, when clocked at some time $t_1$. The output of the first flip flop is logically combined with the one input command that is present to produce a signal which is applied to the input of a second flip flop. The second flip flop is placed in a state indicative of the value of its input, when clocked at some time $t_2$, subsequent to $t_1$. The one input command must be present for the duration $t_1-t_2$ to place the second flip flop in its set state. Thus, two or more input signals of like binary significance applied at the same time are blocked and contact bounce or noise of shorter duration than the fixed period $t_1-t_2$ is prevented from causing erroneous operation.

8 Claims, 6 Drawing Figures

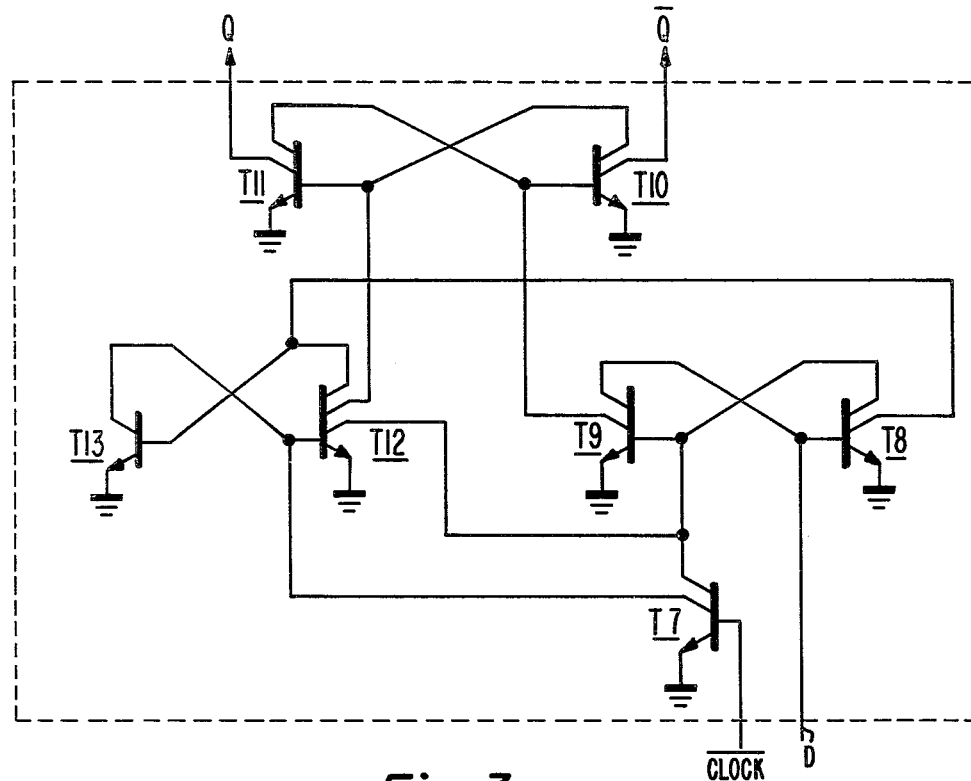
Fig. 3 PRIOR ART
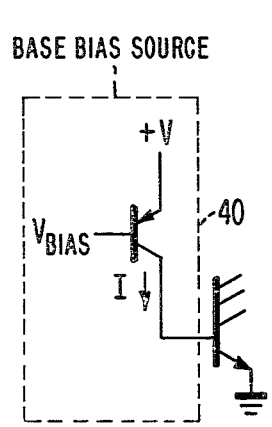
Fig. 4
TABLE I (FOR FIGURE 2)
| $\bar{A}$ | $\bar{B}$ | W | X | Y | Z | V |
|---|---|---|---|---|---|---|
| Hi | Hi | LO | Hi | LO | LO | LO |
| LO | Hi | LO | LO | Hi | LO | Hi |
| LO | LO | Hi | LO | LO | LO | LO |
| Hi | LO | LO | LO | LO | Hi | Hi |
$Y = A\bar{B}$
$Z = \bar{A}B$
$X = \bar{A}\bar{B}$
$W = AB$
$V = A\bar{B} + \bar{A}B$
Fig. 2A

CONTACT DE-BOUNCING CIRCUIT WITH COMMON MODE REJECTION

This invention relates to coincident pulse eliminator circuits having improved noise immunity.

Coincident pulse eliminator circuits are used, for example, in asynchronous logic applications where a circuit is to respond to application of one or another of a plurality of input signals to avoid unpredictable circuit operation arising from input signals that overlap in time. See, for example, "Coincident Pulse Eliminator" by John M. Irwin which was published in the magazine "The Electronic Engineer" in the United States of America in March, 1970, at page 85.

One difficulty with the known pulse eliminator circuitry concerns its susceptability to noise which may accompany the input signals. Where the signals are generated, for example, by electrical switches with contacts that open and close the contact bounce associated therewith represents noise. Other sources of noise include undesired electrostatically and electromagnetically induced signals.

An asynchronous logic application where the combined effects of noise and coincident input signals is particularly troublesome is that of a digital television tuning system where, for example, it is desirable to permit a viewer to close a first switch (S1 in FIG. 1) to select channels in one direction (COUNT UP) or to close a second switch (S2) to select channels in the opposite direction (COUNT DOWN). These two switches may be coupled to an UP/DOWN counter which controls the order of the channel selection. The simultaneous closure (or opening) of the switches S1 and S2 results in the simultaneous application of contrary and incompatible signals to the UP/DOWN counter causing it to respond in an ambiguous or erroneous manner. In a TV receiver contradictory signals may also be produced by "arcing" of the picture tube. "Arcing" results in high level noise signals of like amplitude and polarity to be coupled to, and to be present on, the input lines (connected to the switches). The input signals then contain erroneous, undesirable and unusable information which must be filtered.

It is also well known that when mechanical switches are closed or opened that they tend to "bounce". That is, signals generated immediately following the closing (or opening) of mechanical switches or signals generated in a very noisy electrical environment often have a rapidly and erratically changing characteristic such that the actual value or state of the signals is indeterminate. In most systems it is desirable and/or necessary that these transient signals be filtered.

Circuits embodying the invention include means for blocking the simultaneous application of contradictory signals to a system and means to prevent triggering the system on transient signals.

The circuits include gating means, such as a type of EXCLUSIVE-OR gate, responsive to the application of two or more input signals (which may contain contradictory information) to produce an output of first binary significance only when one of its inputs is present and no contradictory condition exists. The output of first binary significance is coupled to the input of a first flip flop which is placed in its "SET" state when the flip flop is pulsed at a time $t_1$. The output of the first flip flop and the one input that is present are logically combined to produce a signal applied to the input of a second flip flop. The second flip flop is pulsed at a time $t_2$, subsequent to $t_1$, and is placed in a state indicative of the value of its input signal. If the one input is present for the duration $t_1$ to $t_2$ the flip flop is placed in its set state and an enabling output corresponding to the input signal present is produced at the output of the second flip flop. Thus, circuits embodying the invention include means for sampling an input signal, passed by the gating means, at two separate time intervals. If the input signal exists at both sampling time intervals then, and only then, does the circuit pass the input signal through to the system.

The invention is discussed in greater detail below and is shown in the following drawings in which:

FIG. 2A is a truth table setting forth the state of various outputs of FIG. 2 in response to various combinations of the input signals;

FIG. 3 is a schematic diagram of an $I^2L$ D-type flip flop (FF) which may be used in the system of FIG. 1;

FIG. 4 is a schematic diagram detailing the "injection" circuit for applying bias current to the base of each NPN transistor in the circuits of FIGS. 2 and 3.

Figure 2:
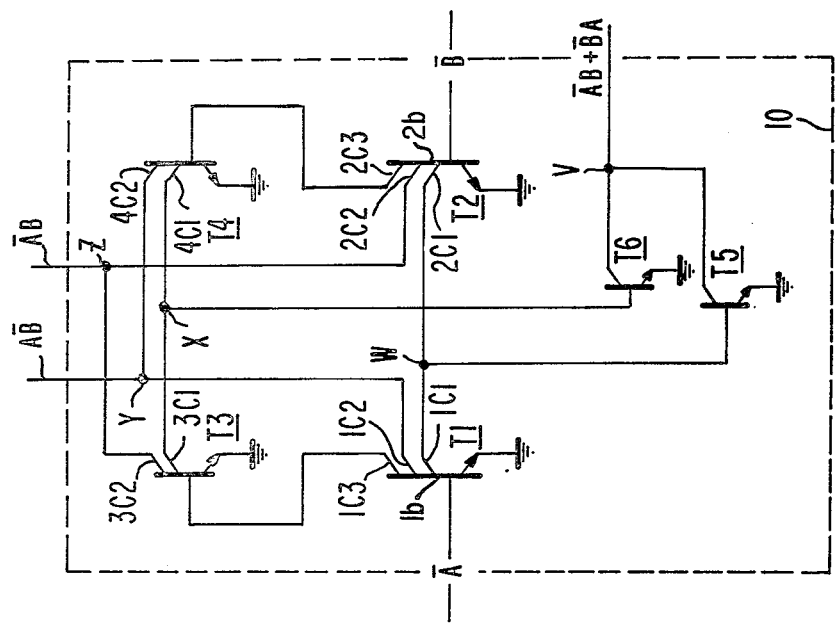
FIG. 2 is a schematic diagram of an integrated-injection-logic ($I^2L$) gate which may be used in the circuit of FIG. 1.

In the description to follow, the circuits are illustrated using bipolar transistors manufactured in accordance with known integrated injection logic ($I^2L$) circuit techniques. This is done by way of illustration only and it should be appreciated that other transistor types and circuit arrangements could be used to perform the functions discussed below.

The collectors and bases of each transistor are identified by the letter "c" and "b", respectively, preceded by the reference numeral identifying that transistor. Each collector of a multi-collector transistor is denoted by the reference numeral of the transistor followed by the letter c and a particular numeral (1, 2, or 3) identifying the collector.

Also, the blocks in the various FIGURES represent electrical circuits which receive inputs representing binary digits (bit) and which produce one or more outputs representing bits. For purposes of the present discussion, it is assumed, arbitrarily, that a relatively high voltage level also referred to as "HIGH", represents the binary "1" state and a relatively LOW level also referred to as LOW represents the binary "0" state. For the sake of brevity in the explanation which follows, it is sometimes stated that a circuit point is a low ("0") or a high ("1") rather than stating that a signal representing a low or a high is applied to, or produced by or at, the circuit point.

Figure 1:
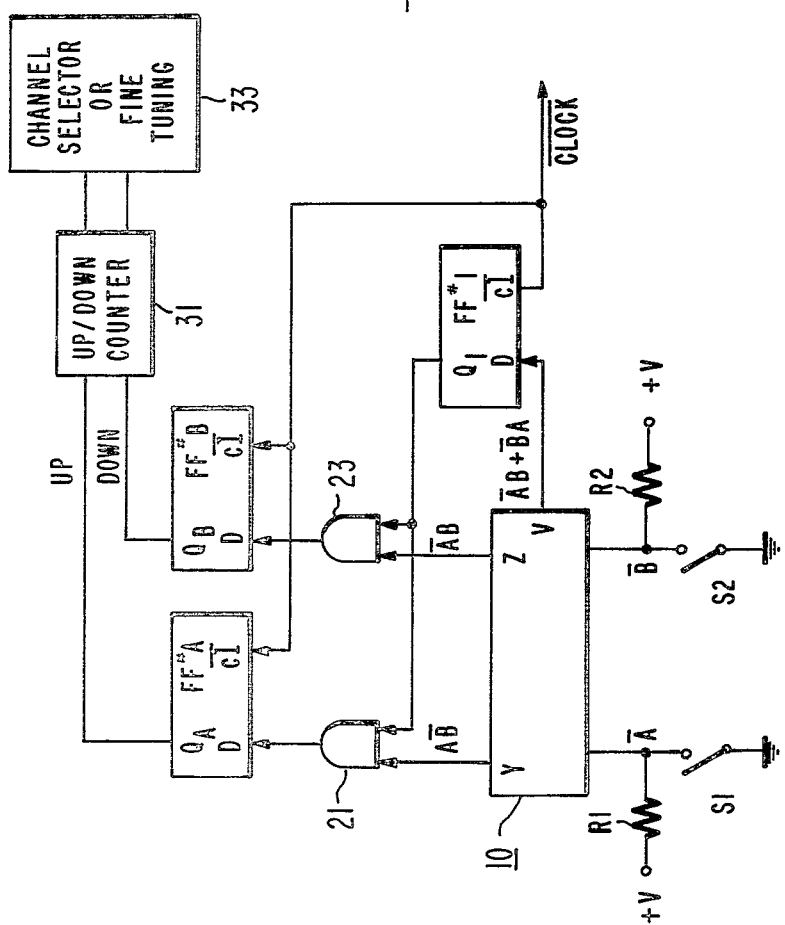
FIG. 1 is a block diagram of a circuit embodying the invention.

FIG. 1 is a block diagram of a debouncing circuit which includes common mode rejection circuitry. Common mode rejection is defined herein as the rejection of simultaneously applied signals of like binary significance commanding the system to perform contradictory functions. Switches, S1 and S2, are shown which, when closed, apply ground signals to the inputs $\overline{A}$ and $\overline{B}$, respectively, of a logic gate 10. The inputs $\overline{A}$ and $\overline{B}$ are normally returned to $+V$ volts (Hi or "1") via resistors R1 and R2, respectively. In a TV system, for example, switches S1 and S2 represent the means provided to a viewer to select channels in the forward and reverse direction, respectively, or the means to fine tune a channel in one or the opposite direction. The signals resulting from the simultaneous closure of S1 and S2 represent commands to the system to perform contrary functions (COUNT-UP, COUNT-DOWN). Electrical signals and commands resulting from the simultaneous closure of switches S1 and S2 or from the presence on the input lines ($\overline{A}$, $\overline{B}$) of like signals are blocked by logic gate 10 whose schematic is shown in FIG. 2 and whose operation is summarized in Table I.

Gate 10 has three outputs, Y, Z and V. At the output Y is formed the function $A\overline{B}$, at the output Z is formed the function $\overline{A}B$, and at the output V is formed the EXCLUSIVE-OR function $A\overline{B}+\overline{A}B$. The V output is applied to the D input of flip flop 1 (FF #1). The Q1 output of FF #1 is ANDED via AND gate 21 with the Y output and the resulting function (Q1·Y) is applied to the D input of a flip flop A (FF #A). Q1 is also ANDED via gate 23 with the Z output and the resulting function (Q1·Z) is applied to the D input of a flip flop B (FF #B). Flip flops 1, A and B may be of the type schematically shown in FIG. 3 and known in the art as a data (D) flip flop.

Each of the D flip flops has two inputs. One input is a timing or clock pulse input shown in FIG. 1 as a $\overline{CLOCK}$ signal. The other (D) input is a signal representing data to be stored. At the time the clock pulse is applied to one input, a signal (LOGIC "1") present on the data input causes the flip flop to assume a set (Q1=HIGH) state. If no data (LOGIC "0") is present on the data input when the clock pulse occurs, the flip flop assumes the reset (Q1=LOW) state. The flip flop of FIG. 3 is of the type which changes state only on a negative going transition (HIGH to LOW) of the $\overline{CLOCK}$ signal. The Q output of the flip flop is set HIGH if the D input is HIGH prior to and during the transition of $\overline{CLOCK}$ from HIGH to LOW and the Q output is set LOW if the D input is LOW prior to and during the transition of $\overline{CLOCK}$ from HIGH to LOW.

The D type flip flop detailed in FIG. 3 is known in the art and so its operation will be explained only briefly. The flip flop includes an input transistor T7; an input latch comprised of transistors T8, T9; and output latch comprised of transistors T10, T11; and an intermediate latch comprised of transistors T12, T13. When the $\overline{CLOCK}$ is HIGH, transistor T7 is ON keeping transistors T9 and T12 OFF so the output latch is undisturbed. However, information at the D input sets the input latch comprised of transistors T8, T9 and this information is transferred to the output latch when the $\overline{CLOCK}$ gate LOW. If D is HIGH when $\overline{CLOCK}$ is HIGH T8 is turned on. When the $\overline{CLOCK}$ goes LOW T7 is turned OFF, T9 is turned OFF being latched OFF by T8 ON, while T12 is turned ON and T13 is turned OFF. T9 OFF and T12 ON cause the turn ON of T10 and the turn OFF of T11 causing $\overline{Q}$ to go LOW and Q to go HIGH. Once the $\overline{CLOCK}$ is LOW, variations at D do not affect the state of the output latch. If D is LOW when the $\overline{CLOCK}$ goes from HIGH to LOW, T8 is turned OFF such that T9 turns ON with T13 turning ON and T12 turning OFF. With T9 ON and T12 OFF T11 is turned ON causing Q to go LOW and T10 is OFF causing $\overline{Q}$ to go HIGH. Again once the $\overline{CLOCK}$ is LOW variations at D do not affect the output latch.

To better explain the operation of the circuit of FIG. 1 the structure and operation of gate 10 will first be detailed. Gate 10 as shown in FIG. 2 includes: (a) input transistors T1 and T2 whose bases, 1b and 2b, respectively, are connected to the $\overline{A}$ and $\overline{B}$ inputs, respectively; and (b) transistors T3, T4, T5 and T6 for forming various functions of the input variables on separate lines. The emitters of all the transistors are returned to ground potential. Signals A and B are produced at the collectors of T1 and T2, respectively. Connecting a collector (1c1) of T1 with a collector (2c1) of T2 at node W forms the AND function (W=AB) of the variables A and B. Connecting the collectors 1c1 and 2c1 to the base of transistor T5 applies the input W to its base. In a like manner the collectors 3c1 and 4c1, interconnected to form the function $X=\overline{AB}$, are connected to the base of transistor T6. The collectors of transistors T5 and T6 are interconnected to form the EXCLUSIVE-OR function $V=\overline{A}B+\overline{B}A$. The collectors 1c2 and 4c2 are interconnected to form the function $Y=A\overline{B}$. The collectors 2c2 and 3c2 are interconnected to form the function $Z=\overline{A}B$. The collectors 1c3 and 2c3 are connected to the bases of T3 and T4, respectively.

Each transistor shown in FIG. 2 (and in FIG. 3) is of NPN conductivity type and has a bias source connected to inject current into its base, which bias source is of the same general type as bias source 40 of FIG. 4. (For clarity of the drawings these bias sources are omitted from the FIGURES, other than FIG. 4, since their presence in I²L circuitry is assumed of course.) The bias source 40 includes a lateral PNP transistor whose emitter is connected to a point of positive operating potential $+V$, whose base is connected to a bias potential ($V_{BIAS}$), and whose collector is connected to the base of an NPN transistor for supplying base current thereto.

The operation of circuit 10 is briefly set forth below. When $\overline{A}$ and $\overline{B}$ are HIGH, T1 and T2 are turned-on and their collectors are LOW. Consequently, W, Y and Z are LOW. Since 1c3 and 2c3 are LOW, T3 and T4 are OFF and X is HIGH. Since X is HIGH T6 is turned on and V is LOW. If $\overline{A}$ and $\overline{B}$ are both LOW T1 and T2 are OFF while T3 and T4 are turned on. Consequently, W is HIGH while X, Y and Z and LOW. Since W is HIGH T5 is turned on and V is LOW.

When $\overline{A}$ is HIGH and $\overline{B}$ is LOW (switch S2 is closed), T1 is ON and T2 is OFF, consequently T3 is OFF and T4 is ON. As a result, W is LOW due to 1c1 being LOW, X is LOW because 4c1 is LOW, Y is LOW because 1c2 is LOW, while Z ($\overline{A}B$) is HIGH because T2 and T3 are OFF. Since W and X are both LOW T5 and T6 are OFF and V is HIGH.

When $\overline{A}$ is LOW (switch S1 closed) and $\overline{B}$ is HIGH, T1 is OFF and T2 is ON, consequently T3 is ON and T4 is OFF. As a result, W is LOW because 2c1 is LOW, X is LOW because 3c1 is LOW, Y ($A\overline{B}$) is HIGH because T1 and T4 are OFF. Since W and X are LOW, T5 and T6 are OFF and V is HIGH.

Thus, V is HIGH only when one of S1 and S2 is closed and the other open, Y is HIGH only when S1 is closed and S2 is open and Z is HIGH only when S1 is open and S2 is closed.

Figure 5:
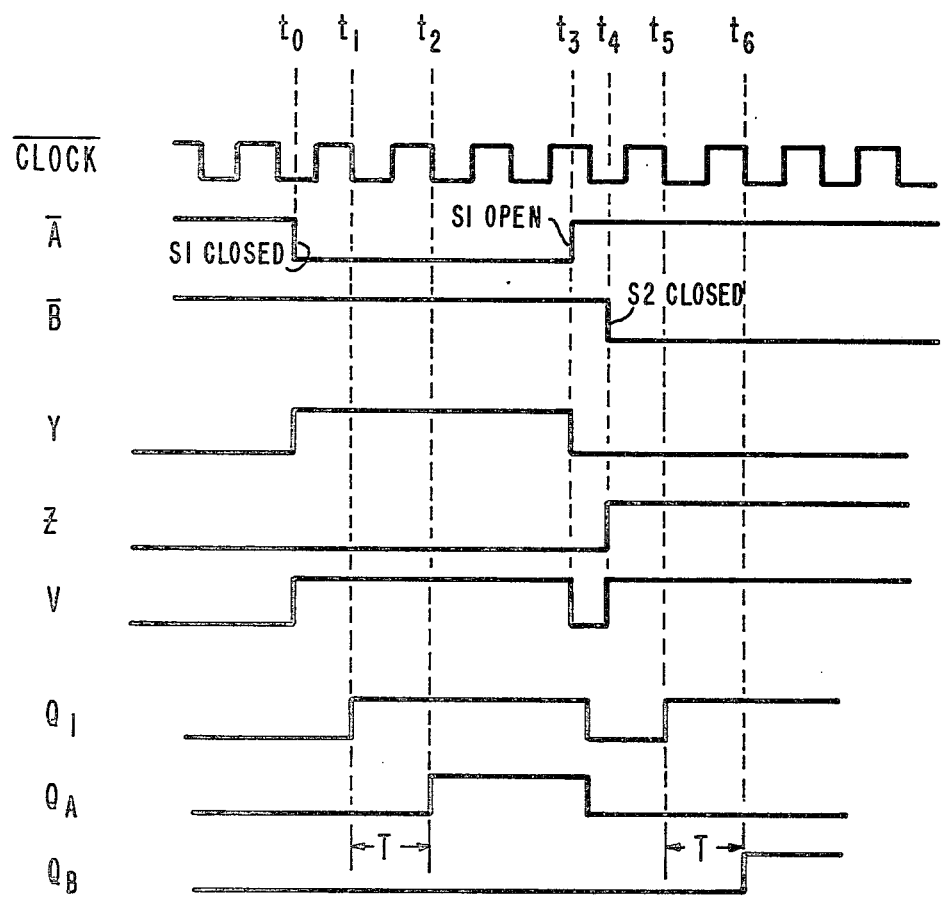
FIG. 5 is a diagram of waveforms at selected nodes of the circuit of FIG. 1.

The operation of the circuit of FIG. 1 is now discussed with reference to the waveform diagram of FIG. 5 and keeping in mind the operation of gate 10 and the flip flops described above.

The EXCLUSIVE-OR output V is HIGH, or logic "1" only when one of the two switches, S1 or S2, is closed (and the other is open). For example, when S1 is closed, at time $t_0$, V and Y go HIGH and remain HIGH so long as S1 remains closed and S2 remains open. Similarly, when S2 is closed at time $t_4$, V and Z go HIGH and remain HIGH so long as S1 remains open and S2 remains closed. Whenever V goes HIGH, the D input of FF #1 goes HIGH. Following V going and remaining HIGH, the next HIGH to LOW transition of the $\overline{\text{CLOCK}}$ pulse sets FF #1 such that Q1 goes HIGH as shown at times $t_1$ and $t_5$.

Q1=HIGH enables AND gates 21 and 23 to pass either the Y=HIGH input to D of FF #A or the Z=HIGH input to D of FF #B. Only one of Y and Z can be HIGH at the same time.

For the condition of S1 closed (S2 open) such that Y=A$\overline{\text{B}}$=HIGH and Q1=HIGH the negative going transition of the clock pulse at time $t_2$, (the transition following the one setting FF #1) causes FF#A to be set to the condition $Q_A$=HIGH. As soon as $Q_A$ goes HIGH a signal is applied to counter 31 causing it to COUNT-UP.

For the condition of S2 closed (S1 open) such that Z=$\overline{\text{A}}$B=HIGH and Q1=HIGH, the negative going transition of the clock pulse at time $t_6$ (the transition following the one setting FF #1 at time $t_5$) sets FF #B such that $Q_B$ goes HIGH. As soon as QB goes HIGH a signal is applied to counter 31 causing it to COUNT DOWN. The counter 31, in turn may be connected to either a channel selector or fine tuning control 33.

Summarizing for FF #1 to be set to Q1=HIGH only one of the two inputs ($\overline{\text{A}}$ or $\overline{\text{B}}$) must be HIGH (present) and for QA or QB to be set HIGH the input ($\overline{\text{A}}$ or $\overline{\text{B}}$) must be HIGH during the negative going transitions of two successive $\overline{\text{CLOCK}}$ pulses. Therefore, in circuits according to the invention only one of the two switches can be closed (or opened) to initiate a command pulse to the system, and practically speaking the closure must extend for a minimum of a full clock period. This ensures that error signals and noise transients will be prevented from erroneously triggering the system and are therefore filtered out. This also ensures that the signal at QA or QB applied to the UP/DOWN counter 31 are relatively free of jitter and noise. That is, the driving signal is a relatively clean step function.

If S1 and S2 are both open or both closed at the same time Y=0, Z=0 and V=0. Q1 gets reset to the LOW state, as shown and AND gates 21 and 23 cause a LOW to be applied to the D inputs of FF#A and FF#B. QA and QB remain LOW (FF #A and FF #B are reset) for this signal condition and no command is applied to the counter 31.

It should be appreciated that AND gates 21 and 23 may in practice be wired "AND" connections. For example, transistor T11 of FF#1 could have two collectors besides that connected to the base of its transistor T10, one of which would be connected to the node Y of circuit 10, and the other one of which would be connected to node Z of circuit 10. Thus, very few components are needed to produce a relatively complex function.

The circuit is designed to prevent noise from initiating the propagation of signals. However, once the viewer has initiated a new channel selection or a new fine tune, a momentary interruption in the action, due to noise, is not noticeable to the viewer and is allowed to occur.

What is claimed is:

1. The combination comprising:
   a plurality of input signals capable of assuming one binary state or the other binary state;
   a first logic gate responsive to said input signals for producing a first output of first binary significance only when one of said input signals is in one binary state and all the other input signals are in the other binary state;
   a first bistable element having a set state and a reset state responsive to the signal at said first output;
   means for placing, at a time $t_1$, said first bistable element in said set state only when said first output is of first binary significance;
   means responsive to said one of said input signals and to the state of said first bistable element for producing a signal coupled to a second bistable element having a set state and a reset state; and
   means for placing said second bistable element in its set state, at a time $t_2$, subsequent to time $t_1$, only when said one of said input signals is in said one binary state and said first bistable element is in said set state.

2. A circuit having first and second input terminals adapted to receive input signals and having first and second circuit output terminals for producing a signal at said first circuit output terminal only when the signal at said first input terminal is present and the signal at said second input terminal is absent, and for producing a signal at said second circuit output terminal only when the signal at said first input terminal is absent and the signal at said second input terminal is present, and signals being produced at said circuit output terminals only if the input signal duration exceeds a given time interval, comprising:
   a first logic gate responsive to the signals at said first and second input terminals for producing a first output of first binary significance only when one of said first and second signals is present and the other one of said first and second signals is absent;
   a first bistable element, having a set state and a reset state, responsive to the signal at said first output;
   means for placing said first bistable element in its set state, at a time $t_1$, only when said first output is of said first binary significance;
   second and third bistable elements, each having a set state, a reset state, a data input point, and at least one output point; one output of said second bistable element being connected to said first circuit output terminal, and one output of said third bistable element being connected to said second circuit output terminal;
   means responsive to the presence of a signal at said first input terminal and to said first bistable element being in a set state for supplying a signal to the data input of said second bistable element of a binary significance to place the latter in its set state;
   means responsive to the presence of a signal at said second input terminal and to said first bistable element being in a set state for supplying a signal to the data input of said third bistable element of a binary significance to place the latter in its set state; and
   means coupled to said second and third bistable element for placing them in the state indicative of the value of the signal applied to their data input, at a time $t_2$, subsequent to said time $t_1$.

3. The combination as claimed in claim 2 wherein said means responsive to the presence of a signal at said first input terminal also includes means responsive to the absence of a signal at said second input terminal; and wherein said means responsive to the presence of a signal at said second input terminal also includes means responsive to the absence of a signal at said first input terminal.

4. The combination as claimed in claim 3 wherein said first logic gate also includes a second gate output and a third gate output, said second gate output for producing a signal of first binary significance only when a signal is present at said first input terminal and a signal is absent at said second input terminal, and said third gate output for producing a signal of first binary significance only when a signal is absent at said first input terminal and a signal is present at said second input terminal.

5. The combination as claimed in claim 4 wherein said means responsive to the presence of a signal at said first input terminal and to said first bistable element being in a set state include means combining said second gate output with an output of said first bistable element; and
   wherein said means responsive to the presence of a signal at said second input terminal and to said first bistable element being in a set state include means combining said third gate output with an output of said first bistable element.

6. The combination as claimed in claim 5 wherein said first logic gate includes first, second, third, fourth, fifth and sixth bipolar transistors; each transistor having a base, an emitter, and said first through fourth transistors having multi-collectors;
   wherein the bases of said first and second transistors are connected to said first and second input terminals, respectively;
   wherein first collectors of said first and second transistors are connected in common to a first node (W) and to the base of said fifth transistor,
   wherein first collectors of said third and fourth transistors are connected in common to a second node (X) and to the base of said sixth transistor,
   wherein the collectors of said fifth and sixth transistors are connected in common to form said first output,
   wherein second collectors of said first and fourth transistors are connected in common to form said second output;
   wherein second collectors of said second and third transistors are connected in common to form said third output,
   wherein a third collector of said first transistor is connected to the base of said third transistor;
   wherein a third collector of said second transistor is connected to the base of said fourth transistor, and
   wherein the emitters of said first through sixth transistors are connected to a common point.

7. The combination comprising:
   first and second input terminals adapted to receive input signals capable of assuming one binary condition or the other binary condition;
   a first logic gate having first and second inputs connected to said first and second input terminals, respectively, and having first, second and third outputs; said first output for producing a signal of first binary significance only when said first input is of one binary value and said second input is of the other binary value; said second output for producing a signal of first binary significance only when said second input is of one binary value and said first input is of the other binary value, said third output for producing a signal of first binary significance only when said first and second inputs have different binary values;
   first, second and third bistable elements each bistable element having a data input, a timing pulse input, and an output, and being responsive to a timing pulse for assuming at its output a state indicative of the value of its data input when pulsed;
   means coupling the third output of said first circuit to said input of said first bistable element,
   means for logically combining the output of said first bistable element with said first output of said first gate and for applying the resulting output to the data input of said second bistable element; and
   means for logically combining the output of said first bistable element with said second output of said second gate and for applying the resulting output to the data input of said third bistable element.

8. The combination as claimed in claim 7 wherein said first logic gate is comprised of first, second, third, fourth, fifth and sixth bipolar transistors; each transistor having a base, an emitter, and said first through fourth transistors having multi-collectors;
   wherein the bases of said first and second transistors are connected to said first and second input terminals, respectively;
   wherein first collectors of said first and second transistors are connected in common to a first node (W) and to the base of said fifth transistor,
   wherein first collectors of said third and fourth transistors are connected in common to a second node (X) and to the base of said sixth transistor;
   wherein the collectors of said fifth and sixth transistors are connected in common to form said third output;
   wherein second collectors of said first and fourth transistors are connected in common to form said first output;
   wherein second collectors of second and third transistors are connected in common to form said second output,
   wherein a third collector of said first transistor is connected to the base of said third transistor;
   wherein a third collector of said second transistor is connected to the base of said fourth transistor; and
   wherein the emitters of said first through sixth transistors are connected to a common point.

* * * * *

UNITED STATES PATENT AND TRADEMARK OFFICE
CERTIFICATE OF CORRECTION

PATENT NO. : 4,185,210

DATED : January 22, 1980

INVENTOR(S) : Borys Zuk

It is certified that error appears in the above-identified patent and that said Letters Patent is hereby corrected as shown below:

On Title Page add --- [30] Foreign Application Priority Data
   May 24, 1977 United Kingdom 21889/77 ---

Col. 3, line 51 "gate" should be --- goes ---.

Signed and Sealed this

Fifteenth Day of April 1980

[SEAL]

Attest:

SIDNEY A. DIAMOND

Attesting Officer

Commissioner of Patents and Trademarks